(12) United States Patent
Ishikawa

(10) Patent No.: US 8,123,976 B2
(45) Date of Patent: Feb. 28, 2012

(54) ALKALINE AQUEOUS SOLUTION COMPOSITION USED FOR WASHING OR ETCHING SUBSTRATES

(75) Inventor: Norio Ishikawa, Soka (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 728 days.

(21) Appl. No.: 12/134,409

(22) Filed: Jun. 6, 2008

(65) Prior Publication Data

US 2009/0001315 A1   Jan. 1, 2009

(30) Foreign Application Priority Data

Jun. 6, 2007  (JP) ................................. 2007-150353

(51) Int. Cl.
*C09K 13/00* (2006.01)
*H01L 21/302* (2006.01)
(52) U.S. Cl. ...................... 252/79.1; 252/79.5; 438/745
(58) Field of Classification Search .................. None
See application file for complete search history.

(56) References Cited

U.S. PATENT DOCUMENTS

| | | | | |
|---|---|---|---|---|
| 4,022,835 | A * | 5/1977 | Shields | 252/184 |
| 5,290,361 | A | 3/1994 | Hayashida et al. | |
| 5,380,468 | A * | 1/1995 | Gober et al. | 510/254 |
| 6,110,839 | A | 8/2000 | Nakano et al. | |
| 6,228,823 | B1 | 5/2001 | Morinaga et al. | |
| 6,585,825 | B1 * | 7/2003 | Skee | 134/3 |
| 7,288,206 | B2 | 10/2007 | Nishimura | |
| 2006/0124590 | A1 | 6/2006 | Nakashima et al. | |

FOREIGN PATENT DOCUMENTS

| | | | |
|---|---|---|---|
| JP | 9-129624 A | 5/1997 | |
| JP | 3503326 | 8/1997 | |
| JP | 3198878 | 6/2001 | |
| JP | 3274834 | 2/2002 | |
| JP | 2005-038969 A | 2/2005 | |
| JP | 2005-158759 A | 6/2005 | |
| JP | 2005-210085 A | 8/2005 | |
| JP | 2005-310845 A | 11/2005 | |
| JP | 2006-165408 A | 6/2006 | |

* cited by examiner

*Primary Examiner* — Shamim Ahmed
*Assistant Examiner* — Bradford Gates
(74) *Attorney, Agent, or Firm* — Wolf, Greenfield & Sacks, P.C.

(57) ABSTRACT

As a washing liquid and an etching solution for semiconductor substrates and glass substrates, alkaline aqueous solutions are used; however, since metal impurities are adsorbed on the substrate surface during processing, a next process for removing the adsorbed metal impurities is required. In addition, when a washing liquid is used, it cannot wash off metal impurities; therefore an acid washing process is required. The present invention provides an aqueous solution composition, which is an alkaline aqueous solution but is able to prevent adsorption of metal impurities, which also has cleaning capability.

By means of an alkaline aqueous solution composition used for washing or etching a substrate, the composition comprising a chelating agent represented by the general formula (1):

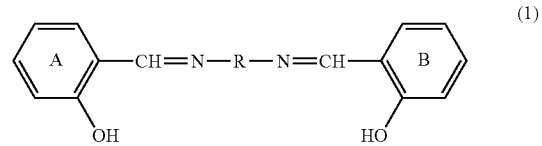

(1)

and an alkaline component, the adsorption of metal impurities on the substrate is prevented, and metal impurities adsorbed on the substrate are washed off.

11 Claims, No Drawings

ALKALINE AQUEOUS SOLUTION COMPOSITION USED FOR WASHING OR ETCHING SUBSTRATES

FIELD OF THE INVENTION

The present invention relates to an alkaline aqueous solution composition used for washing or etching substrates. More specifically, it relates to an alkaline aqueous solution composition which is used to prevent metal impurities in an alkaline solution from being attached to the substrate surface and to remove them by washing, during processes of washing and etching using the alkaline solution which are performed during a silicon wafer manufacturing process, a semiconductor device manufacturing process and other electronic device manufacturing processes.

BACKGROUND OF THE INVENTION

In a process for manufacturing silicon wafers for the production of semiconductors, when a wafer is cut out from a silicon monocrystalline ingot and processed into a predetermined thickness, etching with sodium hydroxide or potassium hydroxide is performed with the aim of achieving uniform etching. During this process, large amounts of metal impurities contained in the sodium hydroxide or potassium hydroxide are adsorbed on the wafer surface. Generally, these impurities are removed by washing with acids such as dilute hydrofluoric acid. However, particularly in the case of low-resistance substrates, Cu and Ni tend to diffuse within the substrate; among them, because Ni diffuses at approximately 80° C. that is a working temperature of sodium hydroxide solutions, metal impurities diffused inside the substrate cannot be removed by the surface washing with acids, which is a problem.

Moreover, in addition to Cu and Ni, large amounts of transition metals such as Fe are adsorbed on the surface of silicon wafers; therefore, it is necessary to remove them by washing with acidic washing liquids, which in turn makes the entire semiconductor manufacturing process longer and more complex, thereby causing problems of an increase in cost and a decrease in throughput.

Furthermore, in a final process of manufacturing silicon wafers or in a process for manufacturing semiconductor devices, especially with the aim of removing particles, an alkaline washing liquid is used. For example, in a process of making transistors (front end of line), a SC-1 solution which is a mixed solution of ammonia and hydrogen peroxide is frequently used. In a washing process after chemical mechanical polishing (CMP) that constitutes a wiring process, an organic alkali such as tetramethylammonium hydroxide is used. Although these washing liquids do not contain metals as their constituents, metal impurities included in the washing liquids as impurities, or slight amounts of metal impurities introduced from previous processes are still adsorbed on the wafer surface, thereby possibly affecting electrical properties of the wafer.

As described above, because an alkaline washing liquid does not have a cleaning capability for metal impurities, or conversely, it tends to cause metal impurities to adsorb on a substrate surface, the alkaline washing liquid is combined with an acidic washing liquid that can clean metal impurities in a general washing process. Here, the above-mentioned SC-1 solution is used by being combined with a SC-2 solution that is an aqueous solution of hydrochloric acid and hydrogen peroxide, or with dilute hydrofluoric acid. This washing process accounts for approximately ⅓ of the entire semiconductor manufacturing process, and the fact that two kinds of liquids (i.e., alkaline washing liquid and acidic washing liquid) are used in there makes the entire semiconductor manufacturing process longer and more complex, thereby causing problems of an increase in cost and a decrease in throughput.

Furthermore, in manufacturing hard discs which are mass-storage devices, conventionally, contamination by microparticles has been a problem, whereas contamination by metals has not been considered as a problem and washing with alkali and acid has been performed. However, it has been clarified that glass substrates are contaminated by metal impurities contained in alkaline washing liquids and this results in particle contamination; thus, a problem similar to that in silicon substrates occurs.

Therefore, in order to prevent adsorption of metal impurities in an alkaline aqueous solution, the use of various complexing agents (chelating agents) has been proposed. Aminocarboxylic acids such as ethylenediamine tetraacetic acid (EDTA) and diethylenetriamine pentaacetic acid (DTPA) have been known as chelating agents from old times, and their use is proposed also in the field of semiconductor manufacturing (JP A No. 2005-310845 and JP A No. 2006-165408); however, the chelating compounds are unstable and their effects are not sufficient.

In addition, other chelating agents have been proposed, including aminophosphonic acids (JP No. 3503326), condensed phosphoric acids (JP No. 3274834), thiocyanate (JP A No. 2005-038969), nitrite ion and nitrate ion (JP A No. 2005-210085). However, many of these chelating agents are intended to be used in SC-1 solutions; therefore, while they are effective in relatively weak alkaline solutions such as ammonia, they are not effective in strong alkaline solutions such as sodium hydroxide and tetramethylammonium hydroxide.

In recent years, ethylenediamine diortho-hydroxyphenyl acetic acid is also proposed as an effective chelating agent (JP No. 3198878); however, while this chelating agent shows larger effects compared to general chelating agents such as EDTA, it is still unable to prevent adsorption of metals, which is required by manufacturers of semiconductors and silicon wafers.

In addition, there are methods other than the use of chelating agents, including a method to dissolve aluminum (JP A No. 2005-158759), and a method to dissolve silicon or silicon compounds (JP A Hei09-129624); however, since these methods require considerable man power and time to dissolve aluminum or silicon, problems of an increase in cost and a decrease in throughput arise.

SUMMARY OF THE INVENTION

Accordingly, an object of the present invention is to provide an alkaline aqueous solution composition to be used in processes of etching and washing a semiconductor substrate or a glass substrate with a strong alkaline aqueous solution, wherein the composition prevents metals from adsorbing on the substrate surface and removes the metals by washing, so that it improves electrical characteristics of semiconductor devices, and also contributes to the improvement of throughput.

The inventors of the present invention devoted themselves to the research so as to solve the above problem, and found that a specific organic compound can solve the above problem and effectively prevent the metal adsorption onto substrates; they further promoted the research and completed this invention.

Namely, the present invention relates to an alkaline aqueous solution composition used for washing or etching a substrate, the composition comprising a chelating agent represented by the general formula (1):

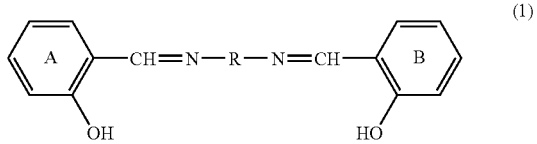

wherein
R is an alkylene with a carbon number of 2-6,1,2-cyclohexylene, or 1,2-phenylene group, wherein any one or more hydrogen atoms may be replaced by the same or different substituents,
rings A and B are benzene rings wherein any one or more hydrogen atoms may be replaced by the same or different substituents,
and wherein the substituents are selected from the group consisting of an alkyl group with a carbon number of 1-10, an alkenyl group with a carbon number of 1-10, an alkynyl group with a carbon number of 1-10, an acyl group with a carbon number of 1-10, an alkoxy group with a carbon number of 1-10, a phenyl group, a benzyl group, a naphthyl group, a carboxyl group, a sulfonate group, a cyano group, a hydroxyl group, a thiol group, an amino group, a halogen and a nitro group, and an alkaline component.

The invention also relates to the alkaline aqueous solution composition, wherein the chelating agent is N,N'-bis(salicylidene)-1,2-ethanediamine, N,N'-bis(salicylidene)-1,2-propanediamine, or N,N'-bis(salicylidene)-1,3-propanediamine.

Furthermore, the invention relates to the alkaline aqueous solution composition, wherein the alkaline component is tetramethylammonium hydroxide.

The invention also relates to the alkaline aqueous solution composition, wherein the alkaline component is sodium hydroxide and/or potassium hydroxide.

Furthermore, the invention relates to the alkaline aqueous solution composition, wherein the aqueous solution composition further comprises another chelating agent.

The invention also relates to the alkaline aqueous solution composition used as a washing liquid, wherein the concentration of the alkaline component is between 0.01 and 1.0 wt %, and the concentration of the chelating agent is between 0.0005 and 1.0 wt %.

Furthermore, the invention relates to the alkaline aqueous solution composition, wherein the aqueous solution composition further comprises an anticorrosive agent.

The invention also relates to the alkaline aqueous solution composition, wherein the aqueous solution composition further comprises a surfactant.

Furthermore, the invention relates to the alkaline aqueous solution composition used as an etching solution, wherein the concentration of the alkaline component is between 1.0 and 50 wt %, and the concentration of the chelating agent is between 0.001 and 5.0 wt %.

The invention also relates to the alkaline aqueous solution composition, wherein the substrate is a silicon wafer, and the Ni concentration on the surface of the silicon wafer after washing or etching becomes $20\times10^{10}$ atoms/cm$^2$ or less.

Furthermore, the invention relates to a method for washing or etching a substrate, wherein the substrate is washed or etched using the alkaline aqueous solution composition so that the Ni concentration on the substrate surface becomes $20\times10^{10}$ atoms/cm$^2$ or less.

The mechanism with which the alkaline aqueous solution composition of the present invention, that is a strong alkaline solution, can effectively prevent adsorption of metal impurities such as Ni onto a substrate surface is not completely clear.

Here, the chelating agent represented by the general formula (I) which is contained in the inventive aqueous solution composition is a quadridentate ligand in a molecule, and is considered to form a chelating structure (formula 2) shown below with a metal such as Ni.

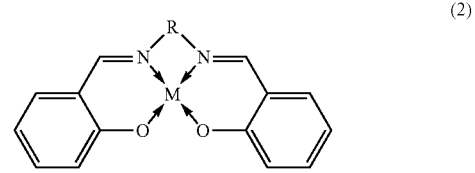

As mentioned above, the chelating agent represented by the general formula (1) of the present invention is considered to form a coordinate bond with a specific metal ion such as Ni in an ideal positional relationship, due to the following reasons including the length of the functional group R, flexibility of the functional group R, and the positional relationship between the ligand atom N of an azomethine bond and the ligand atom O of a phenolic hydroxyl group. In addition, because the chelating agent has an azomethine bond, the agent is considered to have a strong complex structure with strong planarity, and is easy to form a dimmer. Because of these reasons, it is considered that, this chelating agent can form a very stable and strong chelating ring even in a strong alkaline solution, so that it can effectively prevent the adsorption of metal impurities on a substrate surface compared to other chelating agents.

Accordingly, in the chelating agent represented by the general formula (I) of the present invention, the following factors are considered to be particularly important: the length of the functional group R in the molecular structure, flexibility of the functional group R, azomethine bond, and positional relationship between the ligand atom N of an azomethine bond and the ligand atom O of a phenolic hydroxyl group.

The alkaline aqueous solution composition of the present invention makes it possible to suppress the amount of adsorption of Ni onto the surface of a silicon wafer at $20\times10^{10}$ atoms/cm$^2$ or less in an etching process using alkaline solutions, which could not be achieved in conventional semiconductor manufacturing processes.

Moreover, because the adsorption of metal impurities can be prevented and they can be removed by washing in a washing process using an alkaline washing liquid, acid washing can be omitted, thereby significantly reducing the time consumed by washing processes that accounts for approximately ⅓ of the entire semiconductor manufacturing process, leading to a decrease in cost and an increase in throughput.

DESCRIPTION OF THE PREFERRED EMBODIMENTS

The present invention is described below in further detail. The alkaline aqueous solution composition of the present invention is an aqueous solution composition which is used for washing or etching during processes of manufacturing semiconductors and other electronic devices. This aqueous solution composition comprises a chelating agent and an alkaline component and others.

Substrates which are subjected to washing or etching using the inventive aqueous solution composition include silicon wafers and other semiconductor substrates which are used for manufacturing semiconductors and other electronic devices, and glass substrates used for flat panel displays and hard discs.

The chelating agent used in the present invention for preventing adsorption of metals is a chelating agent represented by the general formula (1):

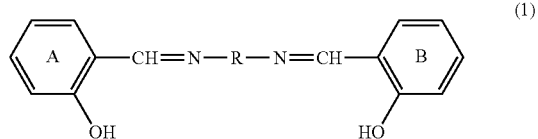

wherein
R is an alkylene with a carbon number of 2-6,1,2-cyclohexylene, or 1,2-phenylene group, wherein any one or more hydrogen atoms may be replaced by the same or different substituents;
rings A and B are benzene rings wherein any one or more hydrogen atoms may be replaced by the same or different substituents;
and preferably, it is a chelating agent of the above general formula (I) wherein the functional group R is an alkylene group with a carbon number of 2-4, and more preferably, it is a chelating agent of the above general formula (1) wherein the functional group R is an alkylene group with a carbon number of 2 or 3.

Specific names of said compounds include N,N'-bis(salicylidene)-1,2-ethanediamine, N,N'-bis(salicylidene)-1,2-propanediamine, N,N'-bis(salicylidene)-1,3-propanediamine, N,N'-bis(salicylidene)-1,4-butanediamine, N,N'-bis(salicylidene)-1,6-hexanediamine, and N,N'-bis(salicylidene)-1,2-benzenediamine; preferably they include N,N'-bis(salicylidene)-1,2-ethanediamine, N,N'-bis(salicylidene)-1,2-propanediamine, N,N'-bis(salicylidene)-1,3-propanediamine, and N,N'-bis(salicylidene)-1,4-butanediamine; and more preferably they include N,N'-bis(salicylidene)-1,2-ethanediamine, N,N'-bis(salicylidene)-1,2-propanediamine, and N,N'-bis(salicylidene)-1,3-propanediamine.

The concentration of these chelating agents is not particularly limited as long as they can exhibit sufficient effects; the concentration is determined based on the comprehensive evaluation of alkali concentration and effects. In the determination, consideration is given to such viewpoints of the chelating agent as exhibiting sufficient effects depending on aims of use, exhibiting an effect proportional to the concentration, and being stored with stability without precipitation.

The concentration of the chelating agent used is, when used as a washing liquid, preferably between 0.0005 and 1.0 wt %, more preferably between 0.001 and 0.5 wt %, and furthermore preferably between 0.005 and 0.1 wt %.

When it is used as an etching solution, the concentration is preferably between 0.001 and 5.0 wt %, more preferably between 0.01 and 1.0 wt %, and furthermore preferably between 0.05 and 0.5 wt %.

The alkaline component used in the present invention is not particularly limited as long as it is an alkaline component used for etching or washing during processes of manufacturing semiconductors and other electronic devices, which includes inorganic alkali such as sodium hydroxide and potassium hydroxide, organic alkali such as tetramethylammonium hydroxide and trimethyl(hydroxylethyl)ammonium hydroxide, and ammonium. Sodium hydroxide, potassium hydroxide and tetramethylammonium hydroxide are particularly preferred.

The concentration of these alkaline components is not particularly limited as long as they can exhibit sufficient effects; the concentration differs significantly depending on aims of use as a treatment liquid. When used as an etching solution, the alkaline component is used with a wide range of concentration from 1 wt % to 50 wt % depending on aims.

When used as a washing liquid, with consideration given to sufficient washing effect and prevention of damage to substrates, the alkaline component is used with a concentration preferably between 0.01 wt % and 1.0 wt %, more preferably between 0.05 wt % and 0.8 wt %, and furthermore preferably between 0.1 wt % and 0.5 wt %.

Since a chelating agent has a specificity to metals, it is effective to co-use multiple chelating agents for washing and to prevent adsorption of various metals. Accordingly, the present invention may comprise other chelating agents.

Other chelating agents used in the present invention are not particularly limited as long as they are a chelating agent used for etching or washing during processes of manufacturing semiconductors and other electronic devices, and they include aminocarboxylic acids such as ethylenediamine tetraacetic acid and nitrilotriacetic acid, organic acids such as citric acid and tartaric acid, nitrogen-containing heterocyclic compounds such as phenanthroline. Ethylenediamine tetraacetic acid is preferred because it forms a complex with a variety of metals.

The concentration of the other chelating agents is not particularly limited as long as they can exhibit sufficient effects; with consideration given to exhibition of sufficient effects and stability during storage, the concentration is preferably between 0.001 and 1 wt %, and more preferably between 0.01 and 0.5 wt %.

When the inventive composition is used as a washing liquid in a washing process after chemical mechanical polishing (CMP) that constitutes a wiring process, because the composition is in contact with wiring materials such as aluminum and copper, the composition may further comprise an anticorrosive agent to prevent corrosion of the wiring materials.

The anticorrosive agent used in the present invention is not particularly limited as long as it is an anticorrosive agent used for substrate processing in processes of manufacturing semiconductors and other electronic devices, and a general anticorrosive agent for aluminum and copper may be used. Anticorrosive agents for aluminum include sugars such as sorbitol, catechol, compounds having a phenolic hydroxyl group such as gallic acid, polymer compounds having a carboxyl group such as polyacrylic acid. Anticorrosive agents for copper include heterocyclic compounds such as benzotriazole and thiourea. Benzotriazole is particularly preferred.

The concentration of the anticorrosive agent is not particularly limited as long as it can exhibit sufficient effects; with consideration given to exhibition of sufficient effects and stability during storage, the concentration is preferably between 0.01 and 5 wt %, and more preferably between 0.05 and 2 wt %.

When the inventive composition is used as a washing liquid in a washing process after chemical mechanical polishing (CMP) that constitutes a wiring process, in order to improve its wettability with insulating films, the inventive composition may further comprise a surfactant.

The surfactant used in the present invention is not particularly limited as long as it is a surfactant used for substrate processing in processes of manufacturing semiconductors and other electronic devices; a non-ionic surfactant is preferred, and a surfactant with a structure of polyoxyalkylene alkylether and polyoxyalkylene alkylphenylether is particularly preferred.

The concentration of the surfactant is not particularly limited as long as it can exhibit sufficient effects; with consideration given to exhibition of sufficient effects and stability during storage, the concentration is preferably between 0.01 and 5 wt %, and more preferably between 0.05 and 2 wt %.

During a washing or etching process using an alkaline solution, the smaller the amount of adsorption of Ni onto the substrate surface, the better. However, with conventional alkaline solutions, it was impossible to suppress the amount of adsorption of Ni onto the surface of a silicon wafer at $20 \times 10^{10}$ atoms/cm$^2$ or less.

Here, in a general semiconductor manufacturing process, when the alkaline aqueous solution composition of the present invention is used, the Ni concentration on the surface of a silicon wafer which has been washed or etched becomes preferably $20 \times 10^{10}$ atoms/cm$^2$ or less, and more preferably $15 \times 10^{10}$ atoms/cm$^2$ or less; furthermore preferably, in the case of P+ low-resistance wafers, it becomes $10 \times 10^{10}$ atoms/cm$^2$ or less.

Accordingly, the alkaline aqueous solution composition of the present invention can exhibit a sufficient effect of preventing the adsorption of Ni onto the surface of substrates such as silicon wafers, which is desired in processes of manufacturing semiconductors.

EXAMPLES

The present invention is explained in more detail using examples and comparative examples. However, the present invention is not limited to these examples; various modifications are possible within the technical idea of the present invention.

Example 1

High-Concentration Sodium-Hydroxide Etching Solution

A clean silicon wafer (P+ type, resistivity: 0.01-0.02 Ω·cm) was immersed into dilute hydrofluoric acid with a concentration of 0.5 wt % at 25° C. for 1 min, washed with water for 1 min, then a natural oxidation film was removed. The resulting silicon wafer was immersed into a treatment liquid, which is prepared to the composition listed in Table 1 by using water as a solvent, at 80° C. for 10 min for etching, washed with water for 5 min and dried. Then the concentrations of Fe and Ni on the surface of this silicon wafer were measured using a total reflection X-ray fluorescence spectrometer. Table 1 shows measurement results.

TABLE 1

| | NaOH (wt %) | Chelating agent (ppm) | Surface concentration* Fe | Ni |
|---|---|---|---|---|
| Example 1 | 48.0 | N,N'-bis(salicylidene)-1,2-ethanediamine 1000 ppm | 12.0 | 2.0 |
| Comparative example 1 | 48.0 | None | 112100 | 12200 |
| Comparative example 2 | 48.0 | Ethylenediamine tetraacetic acid 1000 ppm | 11500 | 9800 |
| Comparative example 3 | 48.0 | diethylenetriamine pentaacetic acid 1000 ppm | 7500 | 11000 |
| Comparative example 4 | 48.0 | Acetylacetone 1000 ppm | 78600 | 9700 |
| Comparative example 5 | 48.0 | Tiron 1000 ppm | 8960 | 7560 |
| Comparative example 6 | 48.0 | 2,2-bipyridyl 1000 ppm | 12500 | 10600 |
| Comparative example 7 | 48.0 | Ethylenediamine diortho-hydroxyphenylacetic acid 1000 ppm | 890 | 26 |

*Unit: $\times 10^{10}$ atoms/cm$^2$

As is clear from the results shown in Table 1, when etching was performed with the strong-alkaline etching solution having 48 wt % sodium hydroxide, the adsorption of Fe and Ni at the levels of $10^{15}$ atoms/cm$^2$ and $10^{14}$ atoms/cm$^2$, respectively, were observed in the case without a chelating agent; whereas in the example 1 of the present invention, the concentrations of Fe and Ni on the surface of the silicon wafer were significantly lower than those in any other comparative examples; thus, it was confirmed that the inventive composition effectively prevents adsorption of metals.

Example 2

Tetramethylammonium-Hydroxide Washing Liquid

A clean silicon wafer was coated with Fe and Ni standard solutions for atomic absorption analysis, the concentrations of which were adjusted to be 10 ppb, and the wafer was left for 1 min so that it was contaminated by Fe and Ni. This silicon wafer was immersed into a treatment liquid, which is prepared to the composition listed in Table 2 by using water as a solvent, at 25° C. for 3 min for washing, then rinsed with running ultra-pure water for 3 min. After rinsing, the silicon wafer was dried and the concentrations of Fe and Ni on the surface of this silicon wafer before and after the treatment were measured using a total reflection X-ray fluorescence spectrometer to evaluate the cleaning capability for Fe and Ni. Table 2 shows measurement results.

Here, contamination levels on the silicon wafer before the washing were on the order of $10^{13}$ atoms/cm$^2$ for both Fe and Ni.

TABLE 2

| | Alkali (wt %) | Chelating agent (ppm) | Surface concentration* Fe | Ni |
|---|---|---|---|---|
| Example 2 | TMAH 0.2 | N,N'-bis(salicylidene)-1,2-ethanediamine 500 ppm | 40 | 4.0 |
| Example 3 | TMAH 0.2 | N,N'-bis(salicylidene)-1,2-propanediamine 500 ppm | 80 | 1.2 |
| Example 4 | TMAH 0.2 | N,N'-bis(salicylidene)-1,2-ethanediamine 1000 ppm | 30 | <1.0 |

TABLE 2-continued

| | Alkali (wt %) | Chelating agent (ppm) | Surface concentration* Fe | Ni |
|---|---|---|---|---|
| Example 5 | TMAH 0.2 | N,N'-bis(salicylidene)-1,2-propanediamine 1000 ppm | 70 | <1.0 |
| Comparative example 8 | TMAH 0.2 | None | 1000 | 300 |
| Comparative example 9 | TMAH 0.2 | Ethylenediamine diortho-hydroxyphenylacetic acid 500 ppm | 400 | 100 |
| Comparative example 10 | TMAH 0.2 | Ethylenediamine diortho-hydroxyphenylacetic acid 1000 ppm | 300 | 20 |

*Unit: $\times 10^{10}$ atoms/cm$^2$

As is clear from the results shown in Table 2, when washing was performed with the strong alkaline washing liquid comprising the organic alkaline component TMAH, the concentrations of Fe and Ni on the surface of the silicon wafer in any of the above examples of the present invention were significantly lower than those in the comparative examples, indicating that the inventive composition effectively prevents adsorption of metals and achieves effective washing.

What is claimed is:

1. An alkaline aqueous solution composition used for washing or etching a substrate, the composition comprising a chelating agent represented by the general formula (I):

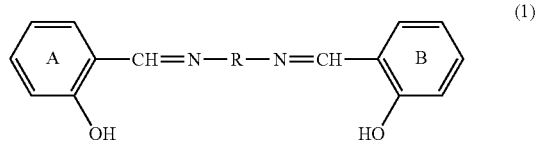

wherein
R is an alkylene with a carbon number of 2-6, 1,2-cyclohexylene, or 1,2-phenylene group, wherein any one or more hydrogen atoms may be replaced by the same or different substituents,
rings A and B are benzene rings wherein any one or more hydrogen atoms may be replaced by the same or different substituents,
and wherein the substituents are selected from the group consisting of an alkyl group with a carbon number of 1-10, an alkenyl group with a carbon number of 1-10, an alkynyl group with a carbon number of 1-10, an acyl group with a carbon number of 1-10, an alkoxy group with a carbon number of 1-10, a phenyl group, a benzyl group, a naphthyl group, a carboxyl group, a sulfonate group, a cyano group, a hydroxyl group, a thiol group, an amino group, a halogen and a nitro group,
and an alkaline component.

2. The aqueous solution composition according to claim 1, wherein the chelating agent is N,N'-bis(salicylidene)-1,2-ethanediamine, N,N'-bis(salicylidene)-1,2-propanediamine, or N,N'-bis(salicylidene)-1,3-propanediamine.

3. The aqueous solution composition according to claim 1, wherein the alkaline component is tetramethylammonium hydroxide.

4. The aqueous solution composition according to claim 1, wherein the alkaline component is sodium hydroxide and/or potassium hydroxide.

5. The aqueous solution composition according to claim 1, wherein the aqueous solution composition further comprises another chelating agent.

6. The aqueous solution composition according to claim 1 which is used as a washing liquid, wherein the concentration of the alkaline component is between 0.01 and 1.0 wt %, and the concentration of the chelating agent is between 0.0005 and 1.0 wt %.

7. The aqueous solution composition according to claim 6, wherein the aqueous solution composition further comprises an anticorrosive agent.

8. The aqueous solution composition according to claim 6, wherein the aqueous solution composition further comprises a surfactant.

9. The aqueous solution composition according to claim 1 which is used as an etching solution, wherein the concentration of the alkaline component is between 1.0 and 50 wt %, and the concentration of the chelating agent is between 0.001 and 5.0 wt %.

10. The aqueous solution composition according to claim 1, wherein the substrate is a silicon wafer, and the Ni concentration on the surface of the silicon wafer after washing or etching becomes $20 \times 10^{10}$ atoms/cm$^2$ or less.

11. A method for washing or etching a substrate, wherein the substrate is washed or etched using the aqueous solution composition according to claim 1 so that the Ni concentration on the substrate surface becomes $20 \times 10^{10}$ atoms/cm$^2$ or less.

* * * * *